US009382625B2

(12) United States Patent
Xue et al.

(10) Patent No.: US 9,382,625 B2
(45) Date of Patent: Jul. 5, 2016

(54) REMOTE PLASMA SOURCE BASED CYCLIC CVD PROCESS FOR NANOCRYSTALLINE DIAMOND DEPOSITION

(71) Applicant: Applied Materials, Inc., Santa Clara, CA (US)

(72) Inventors: Jun Xue, San Jose, CA (US); Jingjing Liu, Santa Clara, CA (US); Yongmei Chen, San Jose, CA (US); Ludovic Godet, Boston, MA (US); Chentsau Ying, Cupertino, CA (US); Shambhu N. Roy, San Jose, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 243 days.

(21) Appl. No.: 14/267,865

(22) Filed: May 1, 2014

(65) Prior Publication Data

US 2015/0315707 A1    Nov. 5, 2015

(51) Int. Cl.
*C23C 16/56* (2006.01)
*C23C 16/27* (2006.01)
*C23C 16/46* (2006.01)
*C23C 16/455* (2006.01)
*C23C 16/505* (2006.01)

(52) U.S. Cl.
CPC .............. *C23C 16/56* (2013.01); *C23C 16/272* (2013.01); *C23C 16/45557* (2013.01); *C23C 16/46* (2013.01); *C23C 16/505* (2013.01)

(58) Field of Classification Search
CPC .. C23C 16/56; C23C 16/45557; C23C 16/27; C23C 16/272; C23C 16/279; C23C 16/46; C23C 16/505
USPC ................................ 427/249.7, 249.8, 249.14
See application file for complete search history.

(56) References Cited

U.S. PATENT DOCUMENTS

| | | | |
|---|---|---|---|
| 5,518,766 A * | 5/1996 | Bigelow | C23C 16/26 427/249.14 |
| 2010/0089318 A1* | 4/2010 | Ovshinsky | C23C 16/452 118/719 |
| 2013/0175546 A1* | 7/2013 | Khan | H01L 21/02085 257/77 |

OTHER PUBLICATIONS

Kim (J. Vac. Sci. Technol. A 13(3) May/Jun. 1995. pp. 1619-1623).*

* cited by examiner

*Primary Examiner* — Joel Horning
(74) *Attorney, Agent, or Firm* — Patterson & Sheridan, LLP

(57) ABSTRACT

Methods for making a nanocrystalline diamond layer are disclosed herein. A method of forming a layer can include activating a deposition gas comprising an alkane and a hydrogen containing gas at a first pressure, delivering the activated deposition gas to the substrate at a second pressure which is less than the first pressure, forming a nanocrystalline diamond layer, treating the layer with an activated hydrogen containing gas to remove one or more polymers from the surface and repeating the cycle to achieve a desired thickness.

20 Claims, 3 Drawing Sheets

REMOTE PLASMA SOURCE BASED CYCLIC CVD PROCESS FOR NANOCRYSTALLINE DIAMOND DEPOSITION

BACKGROUND

1. Field

Embodiments disclosed herein generally relate to methods of forming inert carbon films. More specifically, embodiments generally relate to deposition of nanocrystalline diamond films using a remote plasma source.

2. Description of the Related Art

As the semiconductor industry introduces new generations of integrated circuits (IC's) having higher performance and greater functionality, the density of the elements that form those IC's is increased, while the dimensions, size and spacing between the individual components or elements are reduced. While in the past such reductions were limited only by the ability to define the structures using photolithography, device geometries having dimensions measured in um or nm have created new limiting factors, such as the conductivity of the metallic elements, the dielectric constant of the insulating material(s) used between the elements or challenges in 3D NAND or DRAM processes. These limitations may be benefitted by more durable and higher hardness hardmasks.

Diamond is known as a high hardness material. Due to high hardness, surface inertness, and low friction coefficient, synthetic diamond has been applied as a protective coating and in microelectromechanical systems (MEMS) among other uses. Diamond films, such as nanocrystalline diamond (NCD), have been synthesized by hot filament CVD and microwave CVD. However, there are a variety of difficulties with hot filament CVD and microwave CVD of nanocrystalline diamond films.

In hot filament CVD, a metal filament is used to activate the precursor gases for deposition. As expected, the metal filament is exposed to the precursor gases during the film forming process. As a result, precursor gases can react with the metal filament leading to metal contamination issues in the final product. Compared to hot filament CVD, microwave CVD has fewer contaminant issues. However microwave CVD requires a high process pressure which can affect the film uniformity. Moreover, although microwave plasma from microwave CVD has relatively low energy ions, these ions still can attack the NCD grain boundary and induce grain structure disorder.

Therefore, there is a need for improved methods for diamond film deposition.

SUMMARY

Embodiments disclosed herein generally relate to methods of forming a diamond layer. In one embodiment, a method for depositing a layer can include performing a deposition process comprising delivering a deposition gas to a remote plasma chamber at a first pressure, the deposition gas comprising an alkane precursor and a hydrogen containing precursor; activating the deposition gas to create an activated deposition gas, the activated deposition gas having a ratio of radical species to ionized species; delivering the activated deposition gas through a second volume having a second pressure, the second pressure being less than the first pressure, wherein the ratio of radical species to ionized species increases in favor of the radical species; delivering the activated deposition gas to a substrate in a process volume, the process volume having a third pressure, the third pressure being less than the second pressure; and depositing a nanocrystalline diamond layer on a surface of the substrate, the nanocrystalline diamond layer having an upper surface with polymers formed thereon; etching polymers from the upper surface of the nanocrystalline diamond layer; and repeating the performing of the deposition process and the etching of polymers from the surface to deposit a nanocrystalline carbon stack of the desired thickness.

In another embodiment, a method for depositing a layer can include performing a deposition process; performing a hydrogen plasma cleaning process; and repeating the performing of the deposition process and the hydrogen plasma cleaning process to deposit a nanocrystalline carbon stack of the desired thickness. The deposition process can include delivering a deposition gas to a remote plasma chamber at a first pressure, the deposition gas comprising an alkane precursor and a hydrogen containing precursor; activating the deposition gas to create an activated deposition gas, the activated deposition gas having a ratio of radical species to ionized species; delivering the activated deposition gas through a second volume having a second pressure, the second pressure being less than the first pressure; delivering the activated deposition gas to a substrate in a process volume, the process volume having a third pressure, the third pressure being less than the second pressure; and depositing a nanocrystalline diamond layer on a surface of the substrate, the nanocrystalline diamond layer. The hydrogen plasma cleaning process can include delivering a hydrogen containing gas to a remote plasma chamber; activating the hydrogen containing gas to create an activated hydrogen containing gas; and delivering the activated hydrogen containing gas to the substrate in the process volume.

In another embodiment, a method for depositing a layer can include positioning a substrate in the process volume of a processing chamber, the substrate having a preseeded surface; heating the substrate to a temperature of less than 500 degrees Celsius; performing a deposition process; and repeating the performing of the deposition process to deposit a nanocrystalline carbon stack of the desired thickness. The deposition process can include delivering a deposition gas to a remote plasma chamber at a first pressure between 10 Torr and 100 Torr, the deposition gas comprising methane and hydrogen gas; delivering RF power to activate the deposition gas, creating an activated deposition gas, the RF power being between 1000 W and 3000 W, the activated deposition gas having a ratio of radical species to ionized species; delivering the activated deposition gas through a second volume having a second pressure between 1 Torr and 5 Torr; delivering the activated deposition gas to a substrate in a process volume, the process volume having a third pressure between 500 mTorr and 1 Torr; and depositing a nanocrystalline diamond layer on a surface of the substrate, the nanocrystalline diamond layer having sp2 bonds and sp3 bonds; delivering the hydrogen gas in the absence of the methane to a remote plasma chamber; activating the hydrogen gas to create an activated hydrogen gas; and delivering the activated hydrogen gas to a substrate in a process volume.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments disclosed herein generally relate to forming a carbon-containing layer, such as a nanocrystalline diamond layer, on a substrate. By forming the reactive species remotely and under high pressure the ratio of radicals versus ionized species can be skewed preferentially towards the radical species. The radical species can then be delivered to the substrate to deposit a nanocrystalline diamond layer with preferentially sp3 bonding. Embodiments are more clearly described with reference to the figures below.

Figure 1:
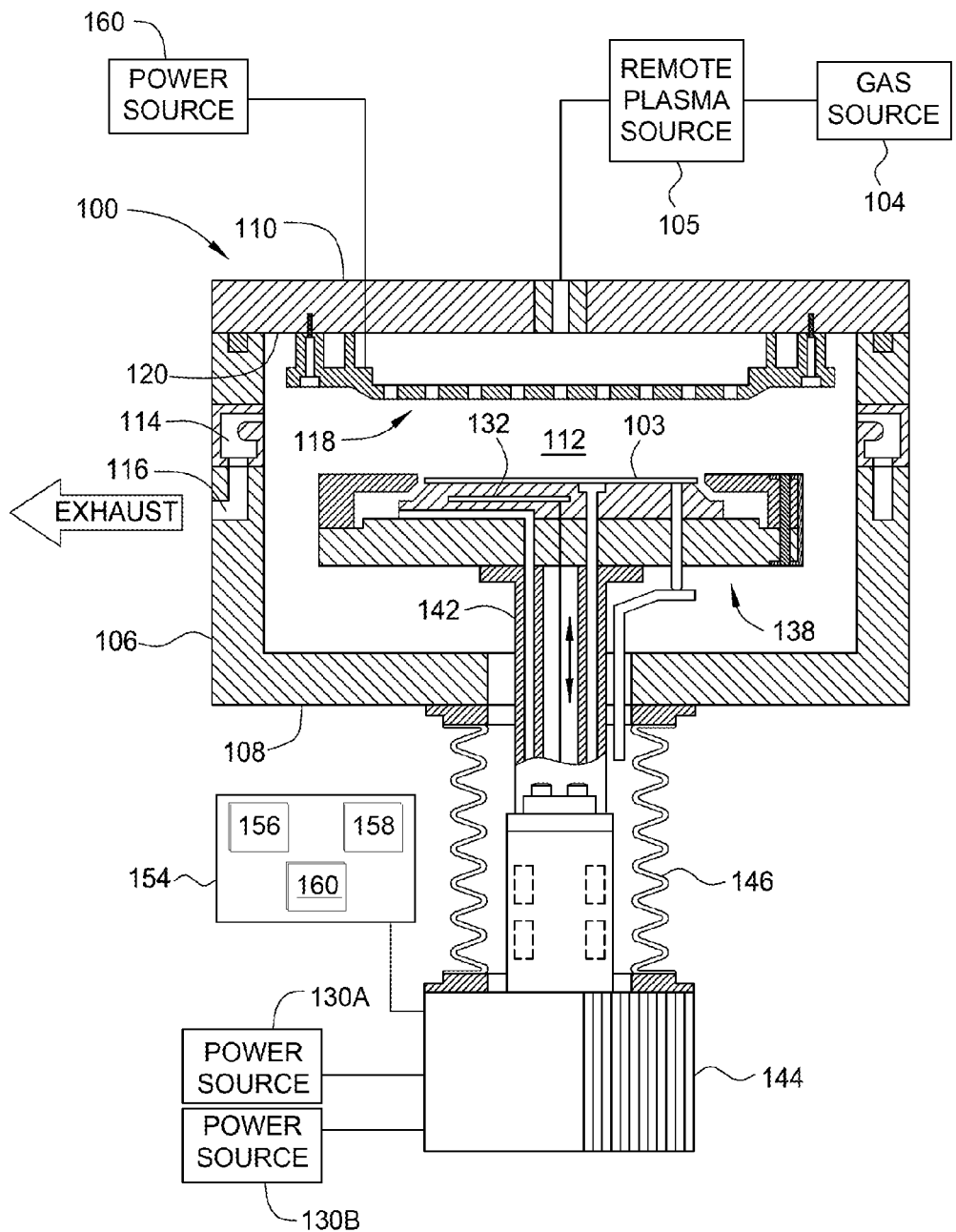
FIG. 1 is a schematic cross-sectional view of a CVD process chamber configured according to one or more embodiments.

FIG. 1 is a schematic cross-sectional view of a CVD process chamber 100 that may be used for depositing a carbon based layer according to the embodiments described herein. A process chamber 100 is available from Applied Materials, Inc. located in Santa Clara, Calif., and a brief description thereof follows. Processing chambers that may be adapted to perform the carbon layer deposition methods described herein is the PRODUCER® chemical vapor deposition chamber, both available from Applied Materials, Inc. located in Santa Clara, Calif. It is to be understood that the chamber described below is an exemplary embodiment and other chambers, including chambers from other manufacturers, may be used with or modified to match embodiments of this invention without diverging from the inventive characteristics described herein.

The process chamber 100 may be part of a processing system (not shown) that includes multiple processing chambers connected to a central transfer chamber (not shown) and serviced by a robot (not shown). The process chamber 100 includes walls 106, a bottom 108, and a lid 110 that define a process volume 112. The walls 106 and bottom 108 can be fabricated from a unitary block of aluminum. The process chamber 100 may also include a pumping ring 114 that fluidly couples the process volume 112 to an exhaust port 116 as well as other pumping components (not shown).

A substrate support assembly 138, which may be heated, may be centrally disposed within the process chamber 100. The substrate support assembly 138 supports a substrate 103 during a deposition process. The substrate support assembly 138 generally is fabricated from aluminum, ceramic or a combination of aluminum and ceramic, and includes at least one bias electrode 132.

A vacuum port may be used to apply a vacuum between the substrate 103 and the substrate support assembly 138 to secure the substrate 103 to the substrate support assembly 138 during the deposition process. The bias electrode 132, may be, for example, the electrode 132 disposed in the substrate support assembly 138, and coupled to a bias power source 130A and 130B, to bias the substrate support assembly 138 and substrate 103 positioned thereon to a predetermined bias power level while processing.

The bias power source 130A and 130B can be independently configured to deliver power to the substrate 103 and the substrate support assembly 138 at a variety of frequencies, such as a frequency between about 1 and about 60 MHz. In one embodiment, the bias power source 130A may be configured to deliver power to the substrate 103 at a frequency of about 2 MHz and the bias power source 130B may be configured to deliver power to the substrate 103 at a frequency of about 13.56 MHz. In another embodiment, the bias power source 130A may be configured to deliver power to the substrate 103 at a frequency of 2 MHz, the bias power source 130B may be configured to deliver power to the substrate 103 at a frequency of 13.56 MHz and a third power source (not shown) is configured to deliver power to the substrate 103 at a frequency of about 60 MHz. Various permutations of the frequencies described here can be employed without diverging from the invention described herein.

Generally, the substrate support assembly 138 is coupled to a stem 142. The stem 142 provides a conduit for electrical leads, vacuum and gas supply lines between the substrate support assembly 138 and other components of the process chamber 100. Additionally, the stem 142 couples the substrate support assembly 138 to a lift system 144 that moves the substrate support assembly 138 between an elevated position (as shown in FIG. 1) and a lowered position (not shown) to facilitate robotic transfer. Bellows 146 provide a vacuum seal between the process volume 112 and the atmosphere outside the chamber 100 while facilitating the movement of the substrate support assembly 138.

The showerhead 118 may generally be coupled to an interior side 120 of the lid 110. Gases (i.e., process and other gases) that enter the process chamber 100 pass through the showerhead 118 and into the process chamber 100. The showerhead 118 may be configured to provide a uniform flow of gases to the process chamber 100. Uniform gas flow is desirable to promote uniform layer formation on the substrate 103. A remote plasma source 105 can be coupled with the process volume 112. Shown here, a remote activation source, such as a remote plasma generator, is used to generate a plasma of reactive species which are then delivered into the process volume 112. Exemplary remote plasma generators are available from vendors such as MKS Instruments, Inc. and Advanced Energy Industries, Inc.

Additionally, a plasma power source 160 may be coupled to the showerhead 118 to energize the gases through the showerhead 118 towards substrate 103 disposed on the substrate support assembly 138. The plasma power source 160 may provide RF power.

The function of the process chamber 100 can be controlled by a computing device 154. The computing device 154 may be one of any form of general purpose computer that can be used in an industrial setting for controlling various chambers and sub-processors. The computing device 154 includes a computer processor 156. The computing device 154 includes memory 158. The memory 158 may include any suitable memory, such as random access memory, read only memory, flash memory, hard disk, or any other form of digital storage, local or remote. The computing device 154 may include various support circuits 160, which may be coupled to the computer processor 156 for supporting the computer processor 156 in a conventional manner. Software routines, as required, may be stored in the memory 156 or executed by a second computing device (not shown) that is remotely located.

The computing device 154 may further include one or more computer readable media (not shown). Computer readable media generally includes any device, located either locally or remotely, which is capable of storing information that is retrievable by a computing device. Examples of computer readable media 154 useable with embodiments of the present invention include solid state memory, floppy disks, internal or external hard drives, and optical memory (CDs, DVDs, BR-D, etc). In one embodiment, the memory 158 may be the computer readable media. Software routines may be stored on the computer readable media to be executed by the computing device.

The software routines, when executed, transform the general purpose computer into a specific process computer that controls the chamber operation so that a chamber process is performed. Alternatively, the software routines may be performed in hardware as an application specific integrated circuit or other type of hardware implementation, or a combination of software and hardware.

Figure 2A:
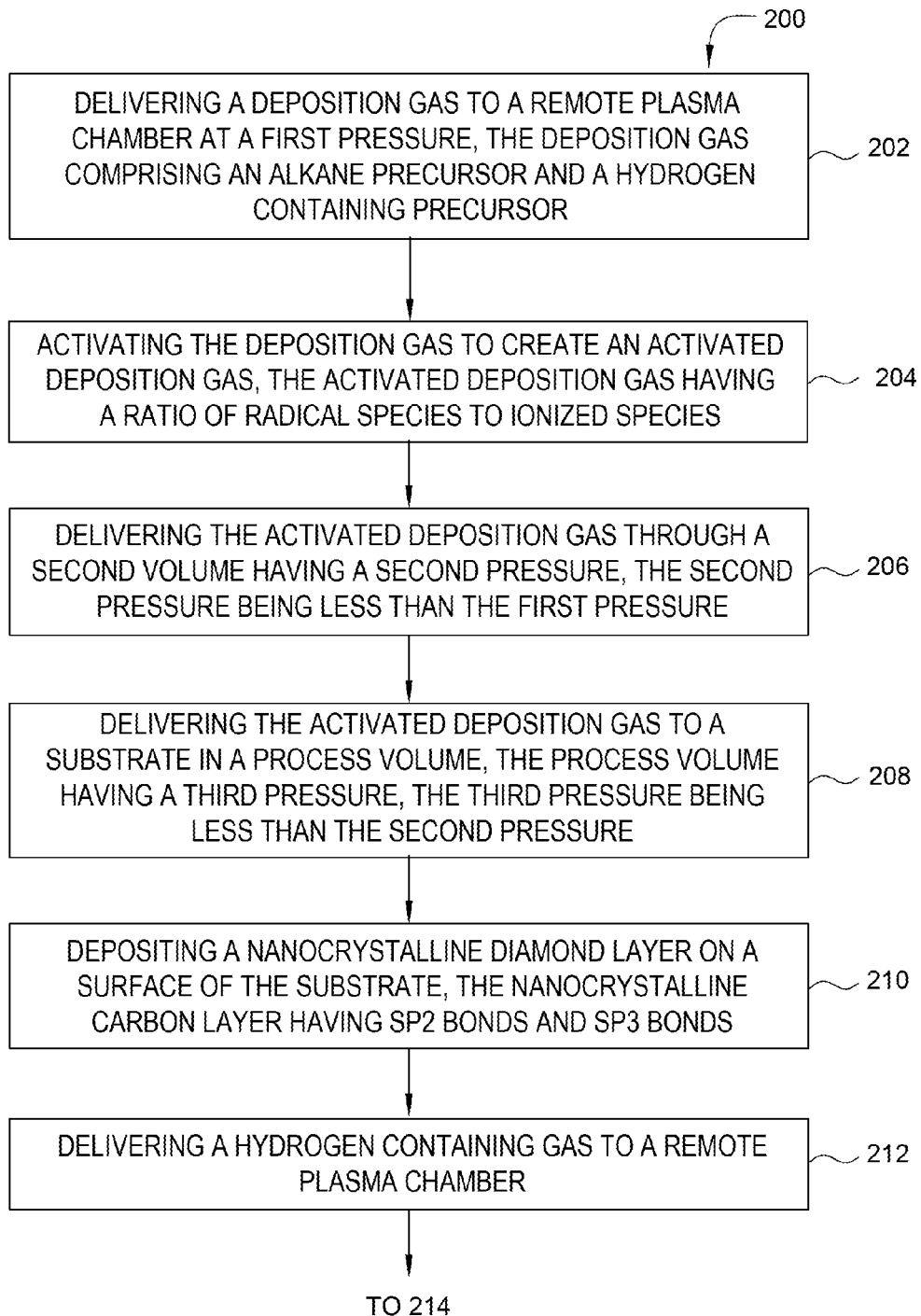
FIGS. 2A and 2B are flow diagrams of a method for forming a nanocrystalline diamond layer, according to one or more embodiments.
Figure 2B:
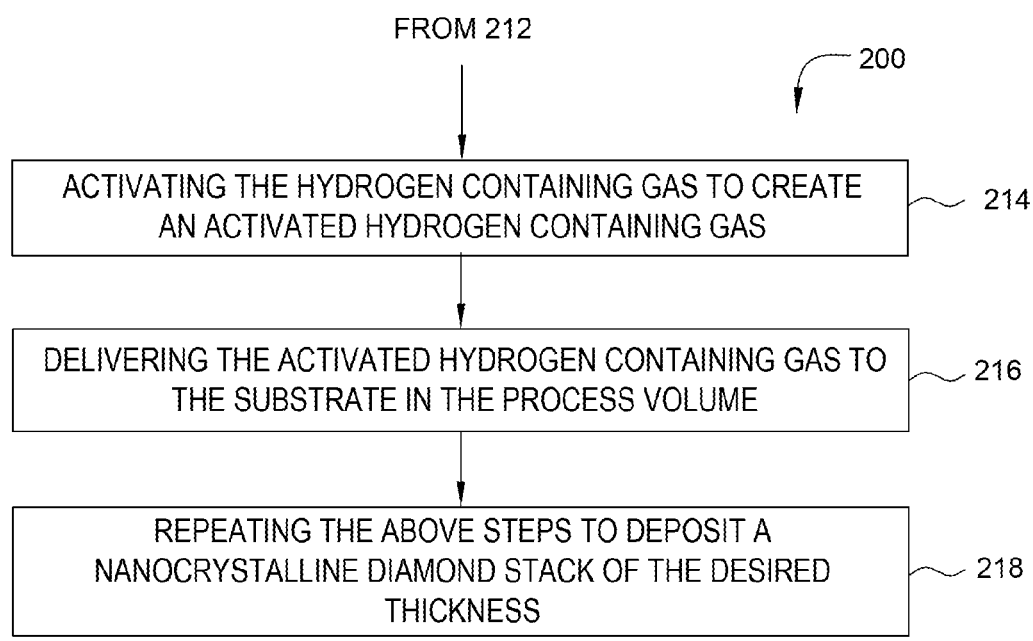

FIGS. 2A and 2B are a flow diagram of a method 200 for forming a nanocrystalline diamond layer, according to one or more embodiments. By activating the deposition gas at a high pressure, the quantity of ionized species in the activated deposition gas is reduced as compared to low pressure. The pressure in the activated deposition gas can then be lowered such that better deposition uniformity is achieved. Polymers, which are formed during the deposition process, can then be removed from the layer surface before repeating the deposition process.

The method 200 begins at 202 by delivering a deposition gas to a remote plasma chamber at a first pressure, at 202. The deposition gas includes a carbon-containing precursor and a hydrogen containing gas. In this embodiment, the carbon-containing precursor is an alkane precursor. The alkane precursor can be a saturated unbranched hydrocarbon, such as Methane, Ethane, Propane, and combinations thereof. Other alkane precursors include n-Butane, n-Pentane, n-Hexane, n-Heptane, n-Octane, and combinations thereof. The hydrogen containing gas can include $H_2$, $H_2O$, $NH_3$ or other hydrogen containing molecules. The deposition gas can further include an inert gas. The inert gas can be a noble gas, such as argon.

The deposition gas is then delivered to the remote plasma chamber. The deposition gas can either mix within the chamber or be mixed prior to entering the chamber. The deposition gas is delivered at a relatively high pressure, such as greater than 5 Torr. In one embodiment, the deposition gas is delivered at between about 10 Torr and 100 Torr, such as about 50 Torr.

The deposition gas can then be activated to create an activated deposition gas, at 204. The deposition gas can be activated by forming a plasma using a power source. Any power source capable of activating the gases into reactive species and maintaining the plasma of reactive species may be used. For example, radio frequency (RF), direct current (DC), or microwave (MW) based power discharge techniques may be used. The power source produces a source plasma power which is applied to the remote plasma chamber to generate and maintain a plasma of the deposition gas. In embodiments which use an RF power for the source plasma power, the source plasma power can be delivered at a frequency of from about 2 MHz to about 170 MHz and at a power level of between 500 W and 5000 W, for a 300 mm substrate (between 0.56 $W/cm^2$ of the top surface of the substrate and 5.56 $W/cm^2$ of the top surface of the substrate). Other embodiments include delivering the source plasma power at from about 1000 W to about 3000 W, for a 300 mm substrate (from 1.11 $W/cm^2$ of the top surface of the substrate to 3.33 $W/cm^2$ of the top surface of the substrate). The power applied can be adjusted according to size of the substrate being processed.

Based on the high pressure in the remote plasma chamber as well as other factors, ionized species formation will be minimized while radical formation is maximized. Without intending to be bound by theory, it is believed that the nanocrystalline diamond layer should be primarily sp3 bonds rather than sp2 bonds. Further, it is believed that more sp3 bonding can be achieved by increasing the number of radical species over ionized species during the deposition of the layer. Ionized species are highly energetic can need more room for movement than radicals. By increasing the pressure, electron energy is reduced while the likelihood of collision with other molecules increases. The decrease in electron energy and increase in number of collisions favors radical formation over ion formation.

Once activated, the activated deposition gas is then delivered through a second volume having a second pressure, at 206. The second volume can be a second chamber or another confined area between the process volume and the remote plasma chamber. In one example, the second volume is the connection between the remote plasma chamber and the process volume.

The second pressure is less than the first pressure. The movement from the remote plasma chamber to the second volume either based on flow rate, change in overall volume or combinations thereof results in a reduced pressure of the activated deposition gas in the second volume. The pressure is reduced to allow for better deposition from the radical species while reducing ionized species collision with the deposited layer. In one embodiment, the second pressure is between about 1 Torr and about 5 Torr.

The activated deposition gas is then delivered to a substrate in a process volume of a processing chamber, at 208. The substrate can be of any composition, such as a crystalline silicon substrate. The substrate can also include one or more features, such as a via or an interconnect. The substrate can be supported on a substrate support. The substrate support can be maintained in a specific temperature range. In one embodiment, the substrate support is maintained in a temperature range of between about 500 degrees Celsius and about 650 degrees Celsius.

The substrate can be preseeded for deposition of the nanocrystalline layer. In one embodiment, the substrate is immersed or otherwise coated in a seeding solution. The seeding solution is an ethanol based nanodiamond suspension. The substrate is immersed in the suspension during an ultrasonic treatment, which adheres some of the suspended nanodiamonds to the surface of the substrate. Other preseeding techniques can be employed without diverging from the embodiments described herein.

The processing chamber used with one or more embodiments can be any CVD processing chamber with a remote plasma source, such as the processing chamber 100 described above or chambers from other manufacturers. Flow rates and other processing parameters described below are for a 300 mm substrate. It should be understood these parameters can be adjusted based on the size of the substrate processed and the type of chamber used without diverging from the invention disclosed herein.

A "substrate surface", as used herein, refers to any substrate or material surface formed on a substrate upon which film processing is performed. For example, a substrate surface on which processing can be performed includes materials such as silicon, silicon oxide, silicon nitride, doped silicon, germanium, gallium arsenide, glass, sapphire, and any other materials such as metals, metal nitrides, metal alloys, and other conductive materials, depending on the application. A substrate surface may also include dielectric materials such as silicon dioxide and carbon doped silicon oxides. Substrates may have various dimensions, such as 200 mm, 300 mm or other diameter wafers, as well as rectangular or square panes.

The process volume receives the activated deposition gas at a third pressure, which is less than the second pressure. The third pressure can be a pressure less than 2 Torr, such as a pressure of between about 500 mTorr and 1 Torr.

A nanocrystalline diamond layer is then deposited on a surface of the substrate, at 210. The radicals from the previously formed activated deposition gas impinge on the substrate surface to form the nanocrystalline diamond layer. Low pressure is believed to be beneficial to the formation of sp3 bonding in the nanocrystalline diamond layer from the remotely formed radicals. The higher pressure in the remote plasma source allows for preferential radical formation while the lower pressure in the process volume allows for more uniform deposition from the previously formed radicals.

Once the nanocrystalline diamond layer is deposited, a hydrogen containing gas is delivered to the remote plasma chamber, at 212. The hydrogen containing gas can be delivered at a separate time or the gas flow from the previous step can be maintained. No alkane precursor is present for this portion. The hydrogen containing gas can be delivered with an inert gas or as part of a combination of multiple hydrogen containing gases.

The hydrogen containing gas is then activated to create an activated hydrogen containing gas, at 214. The hydrogen containing gas can be converted to a plasma using the same pressure, temperature, power type, power ranges and other parameters for formation of the plasma discussed with reference to forming the activated deposition gas.

Once the activated hydrogen containing gas is formed, it can be delivered to the substrate in the process volume, at 216. The process volume and the substrate may be maintained at the same pressure, temperature and other parameters as described above. During the deposition process, it is believed that polymers can form on the surface of the deposited nanocrystalline diamond layer. The polymers can affect further deposition and otherwise degrade performance of the deposited layer. By delivering the activated hydrogen containing gas to the deposited layer, the polymers are made volatile and can then be removed from the chamber, such that they do not affect subsequent deposition processes.

The above elements can then be repeated to deposit a nanocrystalline diamond stack of a desired thickness, at 218. Each deposition cycle produces a thickness of between about 20 Å and about 200 Å, such as about 100 Å. By repeating the above steps, the previous layer acts as a seed layer for the next deposition, allowing for an overall desired thickness to be deposited. In one embodiment, the nanocrystalline diamond stack is deposited to 1 µm thick.

While the foregoing is directed to embodiments of the present invention, other and further embodiments of the invention may be devised without departing from the basic scope thereof, and the scope thereof is determined by the claims that follow.

The invention claimed is:
1. A method for depositing a layer, comprising:
    performing a deposition process comprising:
        delivering a deposition gas to a remote plasma chamber at a first pressure, the deposition gas comprising:
            an alkane precursor; and
            a hydrogen containing precursor;
        activating the deposition gas to create an activated deposition gas, the activated deposition gas having a ratio of radical species to ionized species;
        delivering the activated deposition gas through a second volume having a second pressure, the second pressure being less than the first pressure, wherein the ratio of radical species to ionized species increases in favor of the radical species,
        delivering the activated deposition gas to a substrate in a process volume, the process volume having a third pressure, the third pressure being less than the second pressure; and
        depositing a nanocrystalline diamond layer on a surface of the substrate, the nanocrystalline diamond layer having an upper surface with polymers formed thereon;
    etching polymers from the upper surface of the nanocrystalline diamond layer; and
    repeating the performing the deposition process and the etching polymers from the upper surface to deposit a nanocrystalline carbon stack of a desired thickness.

2. The method of claim 1, wherein the first pressure is between about 10 Torr and about 100 Torr.

3. The method of claim 1, wherein the substrate is maintained at a temperature range of between about 500 degrees Celsius and about 650 degrees Celsius.

4. The method of claim 1, wherein the second pressure is between about 1 Torr and about 5 Torr.

5. The method of claim 1, wherein the third pressure is between about 500 mTorr and about 1 Torr.

6. The method of claim 1, wherein the deposition gas is activated using an RF source.

7. The method of claim 6, wherein the RF source provides power between about 1000 W and 3000 W.

8. The method of claim 1, wherein the polymers are etched from the upper surface using a hydrogen plasma.

9. The method of claim 1, wherein the surface of the substrate is preseeded.

10. The method of claim 1, wherein the alkane is methane.

11. A method for depositing a layer, comprising:
    performing a deposition process comprising:
        delivering a deposition gas to a remote plasma chamber at a first pressure, the deposition gas comprising:
            an alkane precursor; and
            a hydrogen containing precursor;
        activating the deposition gas to create an activated deposition gas, the activated deposition gas having a ratio of radical species to ionized species;
        delivering the activated deposition gas through a second volume having a second pressure, the second pressure being less than the first pressure;
        delivering the activated deposition gas to a substrate in a process volume, the process volume having a third pressure, the third pressure being less than the second pressure; and
        depositing a nanocrystalline diamond layer on a surface of the substrate, the nanocrystalline diamond layer;
    performing a hydrogen plasma cleaning process, comprising:
        delivering a hydrogen containing gas to a remote plasma chamber;
        activating the hydrogen containing gas to create an activated hydrogen containing gas; and
        delivering the activated hydrogen containing gas to the substrate in the process volume; and
    repeating the performing of the deposition process and the hydrogen plasma cleaning process to deposit a nanocrystalline carbon stack of the desired thickness.

12. The method of claim 11, wherein the first pressure is between about 10 Torr and about 100 Torr.

13. The method of claim 12, wherein the second pressure is between about 1 Torr and about 5 Torr.

14. The method of claim 13, wherein the third pressure is between about 500 mTorr and about 1 Torr.

15. The method of claim 11, wherein the substrate is maintained at a temperature range of between about 500 degrees Celsius and about 650 degrees Celsius.

16. The method of claim 11, wherein the deposition gas is activated using an RF source, and wherein the RF source provides power between about 1000 W and 3000 W.

17. The method of claim 11, wherein the delivery of the activated deposition gas transitions to the delivery of the activated hydrogen containing gas without interruption in gas flow.

18. The method of claim 11, wherein the surface of the substrate is preseeded.

19. The method of claim 11, wherein the alkane is methane.

20. A method for depositing a layer, comprising:
   positioning a substrate in the process volume of a processing chamber, the substrate having a preseeded surface;
   heating the substrate to a temperature of less than 500 degrees Celsius;
   performing a deposition process comprising:
      delivering a deposition gas to a remote plasma chamber at a first pressure between 10 Torr and 100 Torr, the deposition gas comprising methane and hydrogen gas;
      delivering RF power to activate the deposition gas, creating an activated deposition gas, the RF power being between 1000 W and 3000 W, the activated deposition gas having a ratio of radical species to ionized species;
      delivering the activated deposition gas through a second volume having a second pressure between 1 Torr and 5 Torr;
      delivering the activated deposition gas to a substrate in a process volume, the process volume having a third pressure between 500 mTorr and 1 Torr; and
      depositing a nanocrystalline diamond layer on a surface of the substrate, the nanocrystalline diamond layer having sp2 bonds and sp3 bonds;
   delivering the hydrogen gas in the absence of the methane to a remote plasma chamber;
   activating the hydrogen gas to create an activated hydrogen gas;
   delivering the activated hydrogen gas to a substrate in a process volume; and
   repeating the performing of the deposition process to deposit a nanocrystalline carbon stack of the desired thickness.

* * * * *